United States Patent
Matsumoto et al.

(10) Patent No.: US 10,955,458 B2
(45) Date of Patent: Mar. 23, 2021

(54) SEMICONDUCTOR DEVICE INSPECTION APPARATUS AND SEMICONDUCTOR DEVICE INSPECTION METHOD

(71) Applicant: HAMAMATSU PHOTONICS K.K., Hamamatsu (JP)

(72) Inventors: Toru Matsumoto, Hamamatsu (JP); Akira Shimase, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 11 days.

(21) Appl. No.: 16/346,594

(22) PCT Filed: Sep. 20, 2017

(86) PCT No.: PCT/JP2017/033944
§ 371 (c)(1),
(2) Date: May 1, 2019

(87) PCT Pub. No.: WO2018/083904
PCT Pub. Date: May 11, 2018

(65) Prior Publication Data
US 2019/0271734 A1      Sep. 5, 2019

(30) Foreign Application Priority Data

Nov. 4, 2016   (JP) .............................. JP2016-216307

(51) Int. Cl.
*G01R 31/265* (2006.01)
*G01R 31/26* (2020.01)
*G01R 31/302* (2006.01)

(52) U.S. Cl.
CPC .......... *G01R 31/265* (2013.01); *G01R 31/26* (2013.01); *G01R 31/302* (2013.01)

(58) Field of Classification Search
CPC ........ G06N 3/00; G06K 1/00; G06K 2207/00; G06T 1/00; G06T 2200/00; G06Q 10/00; G01N 1/00; G01N 2201/00
See application file for complete search history.

(56) References Cited

U.S. PATENT DOCUMENTS 9,188,566 B2 * 11/2015 Georgeson ......... G01N 21/1702
2010/0106431 A1 * 4/2010 Baba ...................... G01N 29/04
702/39

(Continued)

FOREIGN PATENT DOCUMENTS

CN     103402438 A    11/2013
JP     H08-320359 A   12/1996

(Continued)

OTHER PUBLICATIONS

International Preliminary Report on Patentability dated May 16, 2019 for PCT/JP2017/033944.

*Primary Examiner* — Jermele M Hollington
*Assistant Examiner* — Temilade S Rhodes-Vivour
(74) *Attorney, Agent, or Firm* — Faegre Drinker Biddle & Reath LLP

(57) ABSTRACT

A semiconductor device inspection apparatus is an apparatus for inspecting a semiconductor device which is an object to be inspected based on a result signal which is output in accordance with input of a test pattern signal to the semiconductor device, the apparatus including: an ultrasonic transducer, disposed to face the semiconductor device, which generates ultrasonic waves; a stage for moving a relative position of the semiconductor device and the ultrasonic transducer; a stimulation condition control unit for controlling a condition of stimulation by the ultrasonic waves applied to the semiconductor device; and an analysis (Continued)

unit for generating a measurement image based on the result signal which is output from the semiconductor device.

15 Claims, 6 Drawing Sheets

(56) References Cited

U.S. PATENT DOCUMENTS

| | | | | |
|---|---|---|---|---|
| 2011/0120209 A1* | 5/2011 | Rose | ............... | G01M 3/243 |
| | | | | 73/1.82 |
| 2013/0190625 A1* | 7/2013 | Shibamoto | ............ | A61B 8/145 |
| | | | | 600/447 |
| 2016/0069948 A1* | 3/2016 | Ikarashi | ............ | G01R 31/2813 |
| | | | | 324/512 |

FOREIGN PATENT DOCUMENTS

| | | | |
|---|---|---|---|
| JP | H11-304769 | A | 11/1999 |
| JP | 2008-102071 | A | 5/2008 |
| JP | 2010-32295 | A | 2/2010 |
| JP | 2011-53126 | A | 3/2011 |
| JP | 2012-58247 | A | 3/2012 |
| JP | 2016-57187 | A | 4/2016 |

* cited by examiner

SEMICONDUCTOR DEVICE INSPECTION APPARATUS AND SEMICONDUCTOR DEVICE INSPECTION METHOD

TECHNICAL FIELD

The present disclosure relates to a semiconductor device inspection apparatus and a semiconductor device inspection method.

BACKGROUND ART

Patent Literature 1 discloses an apparatus that inspects a semiconductor integrated circuit using ultrasonic heating. In this inspection apparatus, a semiconductor integrated circuit which is an object to be inspected is irradiated with ultrasonic waves while electric power is supplied from a constant voltage source. A current image or a fault image of the semiconductor integrated circuit is generated by detecting a change in a current flowing to ground wiring in accordance with the ultrasonic wave irradiation.

CITATION LIST

Patent Literature

[Patent Literature 1] Japanese Unexamined Patent Publication No. 8-320359

SUMMARY OF INVENTION

Technical Problem

The inspection apparatus of the related art as described above does nothing but generate a current image or a fault image of a semiconductor device by uniformly irradiating the semiconductor device with constant ultrasonic waves, and thus it cannot perform various analyses on a semiconductor device.

An object of the present disclosure is to provide a semiconductor device inspection apparatus and a semiconductor device inspection method which make it possible to perform various analyses on a semiconductor device.

Solution to Problem

According to an aspect, there is provided a semiconductor device inspection apparatus that inspects a semiconductor device which is an object to be inspected based on a result signal which is output in accordance with input of a test pattern signal to the semiconductor device, the apparatus including: an ultrasonic transducer, disposed to face the semiconductor device, which generates ultrasonic waves; a stage that moves a relative position of the semiconductor device and the ultrasonic transducer; a stimulation condition control unit that controls a condition of stimulation by the ultrasonic waves applied to the semiconductor device; and an analysis unit that generates a measurement image based on the result signal which is output from the semiconductor device.

In such a semiconductor device inspection apparatus, the ultrasonic transducer irradiates a semiconductor device with ultrasonic waves, whereby a change in state of the semiconductor device may occur. In a case where a change in state of the semiconductor device occurs, the change in state is output as a result signal. The analysis unit can analyze the semiconductor device by generating a measurement image based on the result signal. The condition of stimulation by the ultrasonic waves applied to the semiconductor device is controlled by the stimulation condition control unit, and thus it is possible to apply various stimulations to the semiconductor device. Therefore, since a result signal which is output in accordance with stimulation applied to even the same semiconductor device may be changed, it is possible to perform various analyses on a semiconductor device.

In addition, in an aspect, the stimulation condition control unit may include a signal generation unit that outputs a driving signal for driving the ultrasonic transducer to the ultrasonic transducer. In this case, the signal generation unit may control at least one of frequency, the number of pulses, a pulse interval, and pulse intensity of the ultrasonic waves by controlling the driving signal. According to such a configuration, the driving signal for driving the ultrasonic transducer is controlled by the signal generation unit, and thus it is possible to control the ultrasonic waves. Particularly, the frequency, the number of pulses, the pulse interval, and the pulse intensity of the ultrasonic waves are controlled, and thus the penetration length of the ultrasonic waves, the magnitude of stimulation applied to the semiconductor device, or the like may be controlled.

In addition, in an aspect, the stimulation condition control unit may include a stage control unit that controls movement of the stage. In this case, the stage control unit may control at least one of a movement speed, a movement interval, and a movement distance of the stage. According to such a configuration, the movement of the stage is controlled by the stage control unit, and thus it is possible to control an aspect of irradiation of the semiconductor device with the ultrasonic waves. Particularly, the movement speed, movement interval, and movement distance of the stage are controlled, and thus, for example, the time of irradiation with the ultrasonic waves may be controlled.

In addition, in an aspect, a reflected wave detection unit that detects reflected waves of the ultrasonic waves reflected from the semiconductor device may be further included, and the analysis unit may generate a reflection image based on a detection signal from the reflected wave detection unit. According to such a configuration, it is possible to acquire a reflection image indicating a chip shape or a circuit pattern of the semiconductor device.

In addition, in an aspect, the analysis unit may generate a superimposed image having the measurement image and the reflection image superimposed on each other. According to such a configuration, since the measurement image and the reflection image indicating a chip shape or a circuit pattern of the semiconductor device are superimposed on each other, the identification of a failure position or the like is facilitated.

In addition, in an aspect, the ultrasonic transducer may include an array transducer. According to such a configuration, it is possible to perform scanning in a direction along the array transducer without moving the relative position of the ultrasonic transducer with respect to the semiconductor device.

In addition, according to an aspect, there is provided a semiconductor device inspection method of inspecting a semiconductor device which is an object to be inspected, the method including: an input step of inputting a test pattern signal to the semiconductor device; a stimulation condition control step of controlling a condition of stimulation by the ultrasonic waves applied to the semiconductor device; an ultrasonic wave scanning step of generating the ultrasonic waves based on the condition and scanning the semiconductor device with the ultrasonic waves; and a measurement image generation step of generating a measurement image based on a result signal which is output from the semiconductor device in accordance with input of the test pattern signal.

In such a semiconductor device inspection method, the semiconductor device is irradiated with ultrasonic waves, whereby a change in state of the semiconductor device may occur. In a case where a change in state of the semiconductor device occurs, the change in state is output as a result signal. It is possible to analyze the semiconductor device by generating a measurement image based on the result signal. It is possible to apply various stimulations to the semiconductor device by controlling the condition of stimulation by the ultrasonic waves applied to the semiconductor device. Therefore, since a result signal which is output in accordance with stimulation applied to even the same semiconductor device may be changed, it is possible to perform various analyses on a semiconductor device.

In addition, in an aspect, the stimulation condition control step may include a signal generation step of generating a driving signal for driving and controlling an ultrasonic transducer that generates the ultrasonic waves. Particularly, the signal generation step may include controlling at least one of frequency, the number of pulses, pulse interval, and pulse intensity of the ultrasonic waves by controlling the driving signal. According to such a configuration, in the signal generation step, the driving signal for driving the ultrasonic transducer is controlled, and thus it is possible to control the ultrasonic waves. Particularly, it is possible to control the penetration length of the ultrasonic waves or the magnitude of stimulation applied to semiconductor device by controlling the frequency, the number of pulses, pulse interval, and pulse intensity of the ultrasonic waves.

In addition, in an aspect, the stimulation condition control step may include a movement control step of controlling movement of a position of irradiation of the semiconductor device with the ultrasonic waves. Particularly, the movement control step may include controlling at least one of the movement speed, the movement interval and the movement distance of the position of irradiation of the semiconductor device with the ultrasonic waves. According to such a configuration, in the movement control step, the movement of the position of irradiation of the semiconductor device with the ultrasonic waves is controlled, and thus it is possible to control an aspect of irradiation of the semiconductor device with the ultrasonic waves. Particularly, it is possible to control, for example, the time of irradiation with the ultrasonic waves by controlling the movement speed, movement interval, and movement distance of the relative position of irradiation of the semiconductor device with the ultrasonic waves.

In addition, in an aspect, a reflection image generation step of detecting reflected waves of the ultrasonic waves reflected from the semiconductor device to generate a detection signal, and generating a reflection image based on the detection signal may be further included. According to such a configuration, it is possible to acquire a reflection image indicating a chip shape or a circuit pattern of the semiconductor device.

In addition, in an aspect, a superimposed image generation step of generating a superimposed image having the measurement image and the reflection image superimposed on each other may be further included. According to such a configuration, since the measurement image and the reflection image indicating a chip shape or a circuit pattern of the semiconductor device are superimposed on each other, the identification of a failure position or the like is facilitated.

Effects of Invention

According to a semiconductor device inspection apparatus and a semiconductor device inspection method of an aspect, it is possible to analyze a semiconductor device in various manners.

DESCRIPTION OF EMBODIMENTS

Figure 1:
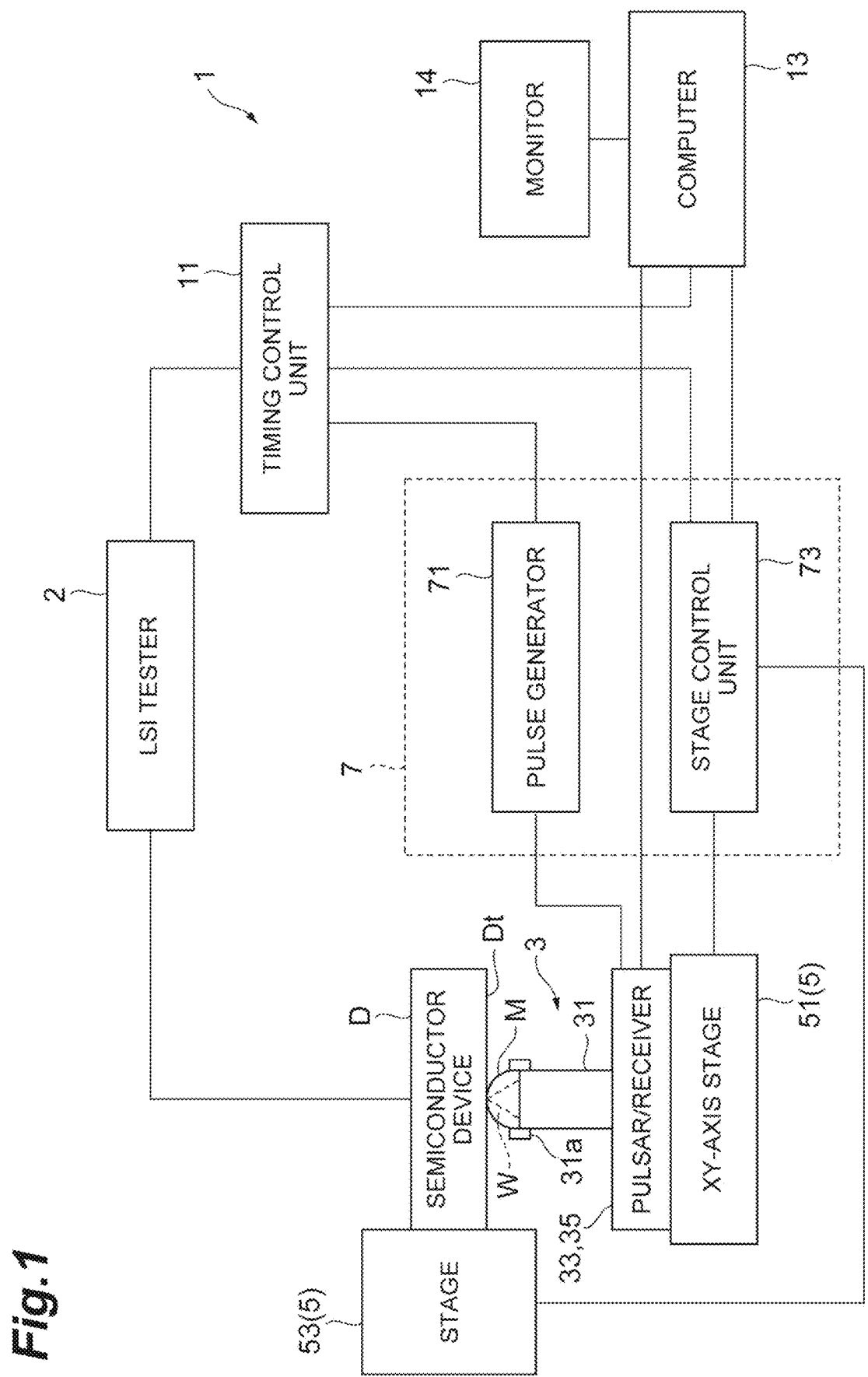
FIG. 1 is a configuration diagram of a semiconductor device inspection apparatus according to an embodiment.

Hereinafter, embodiments will be described in detail with reference to the accompanying drawings. For convenience, components which are substantially the same are denoted by the same reference numerals and signs, and may not be described.

As shown in FIG. 1, a semiconductor device inspection apparatus 1 according to the present embodiment is an apparatus that acquires a result signal which is output in accordance with the input of a test pattern signal to a semiconductor device D which is an object to be inspected. In the semiconductor device inspection apparatus 1, a result signal is acquired while the semiconductor device D with a package is scanned with ultrasonic waves, thereby allowing the presence or absence of a failure and the position of a failure to be identified and the like. One side of the semiconductor device D serves as an inspection surface Dt which is irradiated with ultrasonic waves W. The semiconductor device D is held by a holding plate or the like in a state where the inspection surface Dt is directed downward. On the inspection surface Dt of the semiconductor device D, a chip within the semiconductor device D may be exposed by polishing, cutting or the like. In addition, the inspection surface Dt of the semiconductor device D may be in a packaged state.

Examples of the semiconductor device D include a discrete semiconductor element including a diode, a power transistor or the like, an optoelectronics element, a sensor/an actuator, a logic large scale integration (LSI) constituted by a transistor having a metal-oxide-semiconductor (MOS) structure or a bipolar structure, a memory element, a linear integrated circuit (IC), a mixed device thereof, and the like. In addition, the semiconductor device D may be a package including a semiconductor device, a composite substrate, and the like.

An LSI tester 2 is electrically connected to the semiconductor device D. The LSI tester 2 inputs a test pattern signal to the semiconductor device D. The test pattern signal is a signal for analysis in which a signal of a certain pattern loops in a constant period. The test pattern signal is set by, for example, a user. In addition, the LSI tester 2 generates a result signal indicating Pass/Fail information based on a test signal which is output from the semiconductor device D to which a test pattern signal is input. For example, the LSI tester 2 compares a test signal which is output from the semiconductor device D with a correct test signal according to a design with respect to a test pattern signal. The LSI tester 2 outputs a change in Pass/Fail information based on the comparison result as a result signal.

Further, the LSI tester 2 outputs a generated result signal or various signals according to a test pattern signal. In the present embodiment, the LSI tester 2 outputs, for example, a loop trigger signal, a tester trigger signal or the like synchronized with a test pattern signal. In addition, the LSI tester 2 also serves as a power supply device, and inputs a current which is set in advance to the semiconductor device D. A current which is input to the semiconductor device D is set in advance to a drive voltage or a drive frequency which has a tendency to cause Pass/Fail information in a result signal to be changed. In addition, the power supply device (not shown) may be provided separately from the LSI tester 2, and may be configured to input a current which is set in advance to the semiconductor device D. Meanwhile, in a case where the semiconductor device D has a function of an LSI tester included therein, it is not necessary to prepare an external LSI tester.

The semiconductor device inspection apparatus 1 of the present embodiment includes an ultrasonic wave generation unit 3, a stage 5, a stimulation condition control unit 7, a timing control unit 11, and a computer (analysis unit) 13.

The ultrasonic wave generation unit 3 irradiates the semiconductor device D with the ultrasonic waves W. The ultrasonic wave generation unit 3 includes an ultrasonic transducer 31 and a pulsar 33. The ultrasonic transducer 31 is disposed to face the semiconductor device D, and radiates the ultrasonic waves W toward the semiconductor device D. The ultrasonic transducer 31 is formed, for example, in a cylindrical shape. The apical surface of the ultrasonic transducer 31 is a portion that generates the ultrasonic waves W. The apical surface of the ultrasonic transducer 31 is disposed upward so as to be opposite to the inspection surface Dt of the semiconductor device D. The apex of the ultrasonic transducer 31 is provided with a medium holding unit 31a. The medium holding unit 31a is a portion that holds a medium M between the ultrasonic transducer 31 and the semiconductor device D. The medium M is filled by its surface tension into the path of the ultrasonic waves W ranging from the apical surface of the ultrasonic transducer 31 to the inspection surface Dt of the semiconductor device D. As shown in the drawing, the medium M protrudes further upward than the position of the apex of the medium holding unit 31a due to its surface tension. In the present embodiment, the medium holding unit 31a forms a cylinder formed of a material, such as, for example, a silicone resin, with sufficient flexibility and wettability with respect to the medium M. The medium holding unit 31a is detachably fitted to, for example, the apex of the ultrasonic transducer 31. The medium M is water in the present embodiment. The type of medium M is not particularly limited provided that the package and impedance of the semiconductor device D are matched with each other, and other liquids such as glycerin, gel-like or jelly-like substances or the like may be used therefor.

The ultrasonic waves W radiated from the ultrasonic transducer 31 propagate through the medium M and the semiconductor device D, and stimulate a focused position. That is, the ultrasonic transducer 31 has the focus of the ultrasonic waves W at a position that is a constant distance from its apical surface. The ultrasonic waves W radiated from the ultrasonic transducer 31 are elastically oscillatory waves having a frequency of, for example, approximately 20 kHz to 10 GHz.

The pulsar 33 is a portion that drives the ultrasonic transducer 31 based on a driving signal. In the present embodiment, the pulsar 33 also has a function as a receiver (reflected wave detection unit) 35 that detects reflected waves of the ultrasonic waves W reflected from the inspection surface Dt of the semiconductor device D. The receiver 35 detects the reflected waves of the ultrasonic waves W, and outputs a detection signal indicating a detection result to the computer 13.

The stage 5 is an apparatus that moves a relative position of the semiconductor device D and the ultrasonic transducer 31. In the present embodiment, the stage 5 includes an XY-axis stage 51 and a Z-axis stage 53.

The ultrasonic transducer 31, the pulsar 33 and the receiver 35 are fixed onto the XY-axis stage 51. The XY-axis stage 51 moves the ultrasonic transducer 31, the pulsar 33 and the receiver 35 in the in-plane direction (XY-axis direction) of the inspection surface Dt of the semiconductor device D. Thereby, the position of irradiation with the ultrasonic waves W on the inspection surface Dt of the semiconductor device D is scanned. In addition, the semiconductor device D is fixed to the Z-axis stage 53. For example, the semiconductor device D may be fixed to the Z-axis stage 53 while being held by the holding plate or the like. The Z-axis stage 53 moves the semiconductor device D in the thickness direction (Z-axis direction) of the semiconductor device D. Thereby, the focal position of the ultrasonic waves W is adjusted with a constant accuracy in the thickness direction of the semiconductor device D. Meanwhile, the stage 5 may be configured to move the relative position of the semiconductor device D and the ultrasonic transducer 31 by moving only any one of the ultrasonic transducer 31 and semiconductor device D. For example, the XY-axis stage 51 may have a mechanism that moves the relative position in the Z-axis direction, or the Z-axis stage 53 may have a mechanism that moves the relative position in the XY-axis direction.

The timing control unit 11 generates a pixel clock in accordance with a loop trigger signal which is input from the LSI tester 2. The pixel clock is a timing signal equivalent to one pixel unit of a scanning range in the semiconductor device D. The pixel clock is output to a pulse generator 71 and a stage control unit 73. In addition, the timing control unit 11 outputs a result signal which is input from the LSI tester 2 to the computer 13.

The stimulation condition control unit 7 controls the conditions of stimulation by the ultrasonic waves W applied to the semiconductor device D. In the present embodiment, the stimulation condition control unit 7 includes the pulse generator (signal generation unit) 71 and the stage control unit 73.

The stage control unit 73 controls at least one of the movement speed, movement interval, and movement distance of the stage 5 in accordance with a pixel clock. In the present embodiment, the stage control unit 73 controls the movements of the XY-axis stage and the Z-axis stage, to thereby control the movement speed, movement interval, and movement distance when the relative position of the semiconductor device D and the ultrasonic transducer 31 is moved, or to control the resolution of a reflection image to be described later. In addition, the stage control unit 73 sequentially outputs position information of the stage 5 during scanning control to the computer 13. Position information determined by the XY-axis stage 51 in the position information of the stage 5 corresponds to the position of scanning with the ultrasonic waves W radiated from the ultrasonic transducer 31. The stage control unit 73 may control the stage 5 so as to continuously move the position of irradiation with the ultrasonic waves W during scanning control of the ultrasonic waves W. In addition, the stage control unit 73 may perform control so that the position of irradiation with the ultrasonic waves is moved pixel by pixel during scanning control of the ultrasonic waves, that is, the stage 5 repeats movement and stopping. Further, the stage control unit 73 may move the relative position of the semiconductor device D and the ultrasonic transducer 31 in the Z-axis direction during scanning control of the ultrasonic waves.

The pulse generator 71 outputs a driving signal for driving the ultrasonic transducer 31 to the pulsar 33. For example, the frequency of the driving signal is set to a frequency equal to the frequency of the ultrasonic waves W generated by the ultrasonic transducer 31. The pulse generator 71 controls the driving signal so as to control at least one of the frequency, the number of pulses, the pulse interval, and the pulse intensity of the ultrasonic waves W. In the present embodiment, burst waves may be used as the ultrasonic waves W. In the burst waves, continuous waves of the ultrasonic waves are repeated multiple times at predetermined intervals. In this case, the frequency of the ultrasonic waves controlled by the pulse generator 71 is the frequency of ultrasonic waves constituting continuous waves. In addition, the number of pulses is the number of continuous waves repeated per unit time. In addition, the pulse interval is an interval between continuous waves. In addition, the pulse intensity is the amplitude of a pulse. The pulse generator 71 continuously outputs a driving signal, and thus ultrasonic waves may be continuously generated from the ultrasonic wave generation unit 3. In addition, the pulse generator 71 may not output a driving signal, for example, during the movement of the stage 5 in accordance with control of the stage 5 so that the ultrasonic waves W are not radiated.

The computer 13 is configured to include, for example, a CPU and a RAM and a ROM which are recording media, and has a display unit such as a monitor 14 and an input unit such as a mouse or a keyboard. Examples of such a computer 13 include a personal computer, a cloud server, a smart device (such as a smartphone or a tablet terminal), a microcomputer, a field-programmable gate array (FPGA), and the like. The computer 13 generates a measurement image by mapping a result signal which is input from the LSI tester 2 based on the position information which is input from the stage control unit 73. In addition, the computer 13 maps a detection signal which is output from the receiver 35 during the inspection of the semiconductor device D based on the position information which is output from the stage control unit 73, and generates a reflection image. In generating the reflection image, only a time component of the detection signal from the receiver 35 which corresponds to reflected waves from the surface of a chip within the semiconductor device D may be extracted. In this case, it is possible to obtain a reflection image indicating a chip shape or a circuit pattern within the semiconductor device D.

In addition, the computer 13 generates a superimposed image having the measurement image and the reflection image superimposed on each other. The computer 13 outputs the generated superimposed image to the monitor 14. In the superimposed image, the reaction of the semiconductor device D indicated by an analysis image is superimposed on a chip shape or a circuit pattern within the semiconductor device D indicated by the reflection image, and the identification of a failure position of a chip is facilitated. In the reflection image, a physical abnormality such as peeling-off of a circuit may be able to be confirmed. Therefore, in the superimposed image, in a case where an abnormal position capable of being confirmed from the analysis image and an abnormal position capable of being confirmed from the reflection image overlap each other, the abnormal position may be highlighted.

Figure 2:
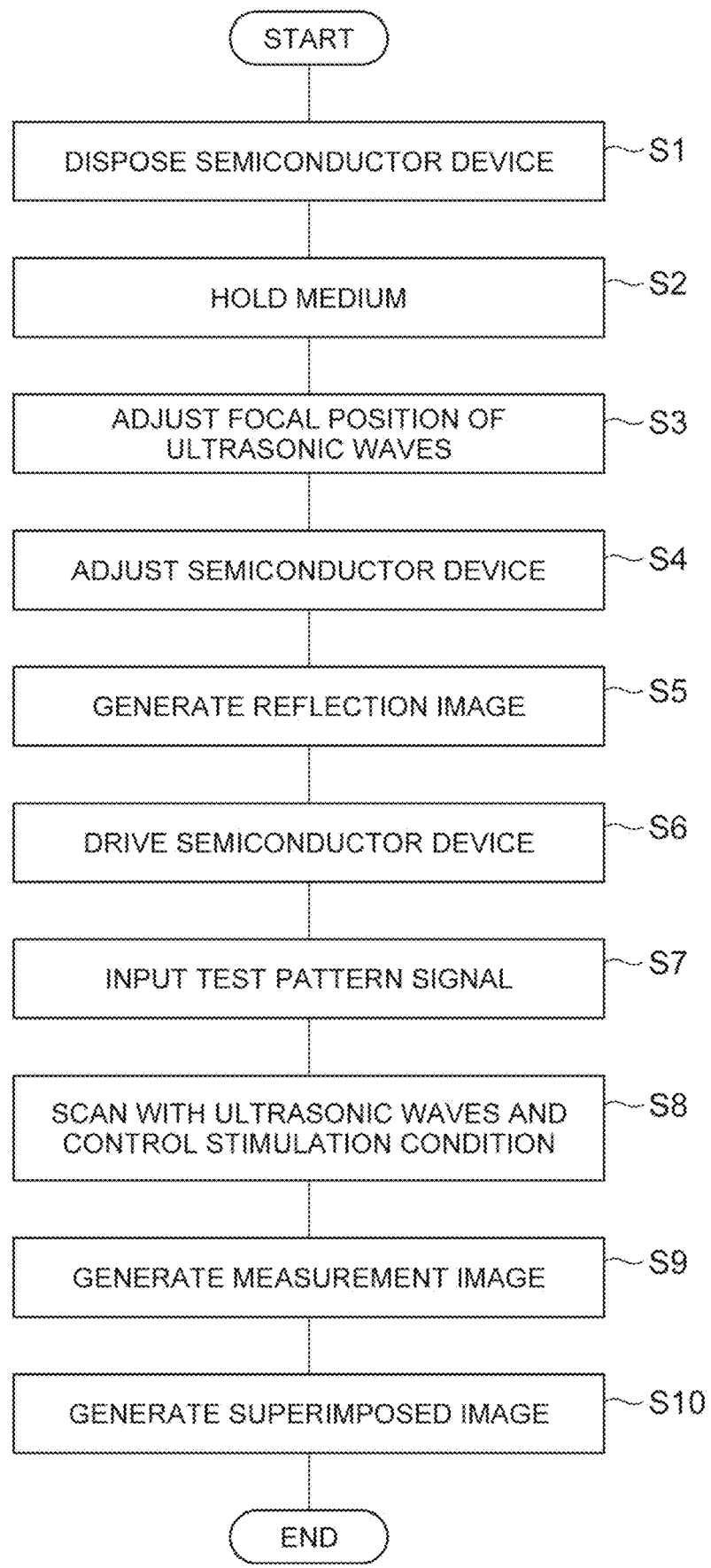
FIG. 2 is a flow diagram illustrating a semiconductor device inspection method which is executed by the semiconductor device inspection apparatus.

Hereinafter, a semiconductor device inspection method in the present embodiment will be described with reference to FIGS. 2 to 4. FIG. 2 is a flow diagram illustrating an example of an operation of the semiconductor device inspection apparatus 1. As shown in the drawing, in a case where the semiconductor device D is inspected using the semiconductor device inspection apparatus 1, first, the semiconductor device D is disposed on a holding plate or the like which is not shown in the drawing (step S1). Next, the medium M is held by the medium holding unit 31a (step S2). In step S2, as described above, a protruding portion of the medium M caused by its surface tension is formed. The Z-axis stage 53 is driven in the Z-axis direction so that the upper end of the medium holding unit 31a does not touch the inspection surface Dt of the semiconductor device D and that only the protruding portion of the medium M touches the inspection surface Dt of the semiconductor device D.

After the medium M is held, the focal position of the ultrasonic waves W is adjusted (step S3). Here, first, while the stage 5 is moved in the X-axis direction and the Y-axis direction, the ultrasonic transducer 31 is moved to a position which is opposite to a chip within the semiconductor device D. The Z-axis stage 53 is driven in the Z-axis direction so that focal position of the ultrasonic waves W is coincident with the surface of the chip within the semiconductor device D based on the waveform pattern of reflected waves of the ultrasonic waves W output from the receiver 35. Meanwhile, the adjustment of the focal position of the ultrasonic waves W may be automatically executed by the stage control unit 73, or may be executed by a user of the semiconductor device inspection apparatus 1 manually moving the position of the Z-axis stage 53.

After the adjustment of the focal position of the ultrasonic waves W, the adjustment of the semiconductor device D is executed (step S4). Here, the inclination of the semiconductor device D may be adjusted. In step S4, for example, the posture of the semiconductor device D is adjusted by the holding plate or the stage 5 so that the waveform patterns of reflected waves the stage 5 is driven for each axis in the X-axis direction and the Y-axis direction are coincident with each other. In addition, the XY-axis is adjusted while detecting the reflected wave of the ultrasonic waves reflected from the semiconductor device D, and confirming whether the position of the semiconductor device D is set to a position desired to be measured. In the step, similarly, the above adjustment may be automatically executed by the stage control unit 73, or may be manually performed by a user of the semiconductor device inspection apparatus 1.

Subsequently, the reflection image is generated (step S5: reflection image generation step). The ultrasonic wave generation unit 3 is moved along the in-plane direction of the semiconductor device D, and the position of irradiation with the ultrasonic waves W is scanned. The reflected waves reflected from the semiconductor device D are detected by the receiver 35, and a detection signal is output. The computer 13 generates a reflection image of the semiconductor device D based on the detection signal and the position of irradiation with the ultrasonic waves. The reflection image generated in step S5 can be displayed on the monitor 14 by the computer 13.

Subsequently, the semiconductor device D is driven (step S6). In the present embodiment, a current having a drive voltage and a drive frequency in the vicinity of a boundary having a change in a Pass/Fail state of the semiconductor device D is applied to the semiconductor device D by the LSI tester 2. For example, as in soft defect localization (SDL) measurement in which the semiconductor device D is heated by a laser beam, conditions of a drive voltage and a drive frequency in the vicinity of a boundary having a change in a Pass/Fail state may be obtained in advance using a shmoo plot when the semiconductor device D is heated all around by a heater or the like.

Subsequently, a test pattern signal is input from the LSI tester 2 to the semiconductor device D (step S7: input step), and scanning by the ultrasonic waves W and control of the stimulation condition are executed (step S8: stimulation condition control step, ultrasonic wave scanning step, signal generation step, and movement control step). The condition of the test pattern signal which is input to the semiconductor device D, a scanning region in which measurement is executed in the semiconductor device D, or the like is set by a user. The scanning region may be set on the basis of, for example, the reflection image generated in step S5. In the present embodiment, while the test pattern signal is input from the LSI tester 2 to the semiconductor device D, the ultrasonic wave generation unit 3 is moved along the in-plane direction of the semiconductor device D, and the position of irradiation with the ultrasonic waves W is scanned. A test signal from the semiconductor device D is detected by the LSI tester 2, and a result signal is output. The output result signal is input to the computer 13 through the timing control unit 11. One loop's worth of length of the test pattern signal may be associated with one pixel's worth of scanning time. In this case, at least one of the frequency, the number of pulses, the pulse interval, and the pulse intensity of a driving signal which is input from the pulse generator 71 to the ultrasonic wave generation unit 3 is adjusted, and thus it is possible to adjust stimulation by the ultrasonic waves W in one pixel. For example, first, all pixels in a scanning region may be measured while the pixels are stimulated with ultrasonic waves of predetermined frequency, the number of pulses, pulse interval, and pulse intensity, and the same scanning region may be measured again while the region is stimulated with ultrasonic waves in which at least one of frequency, the number of pulses, pulse interval, and pulse intensity is changed. In addition, only a region in which change initially occurs in Pass/Fail information due to the stimulation of ultrasonic waves may be measured again.

Subsequently, a measurement image is generated (step S9: measurement image generation step). That is, the computer 13 maps image data according to input result information in association with the position of irradiation with the ultrasonic waves W, to thereby generate a measurement image having position information and Pass/Fail information associated with each other. The measurement image generated in step S9 can be displayed on the monitor 14 by the computer 13. In addition, a superimposed image having an analysis image and a reflection image superimposed on each other is generated by the computer 13, and the superimposed image is displayed on the monitor 14 (step S10: superimposed image generation step).

Figure 3:
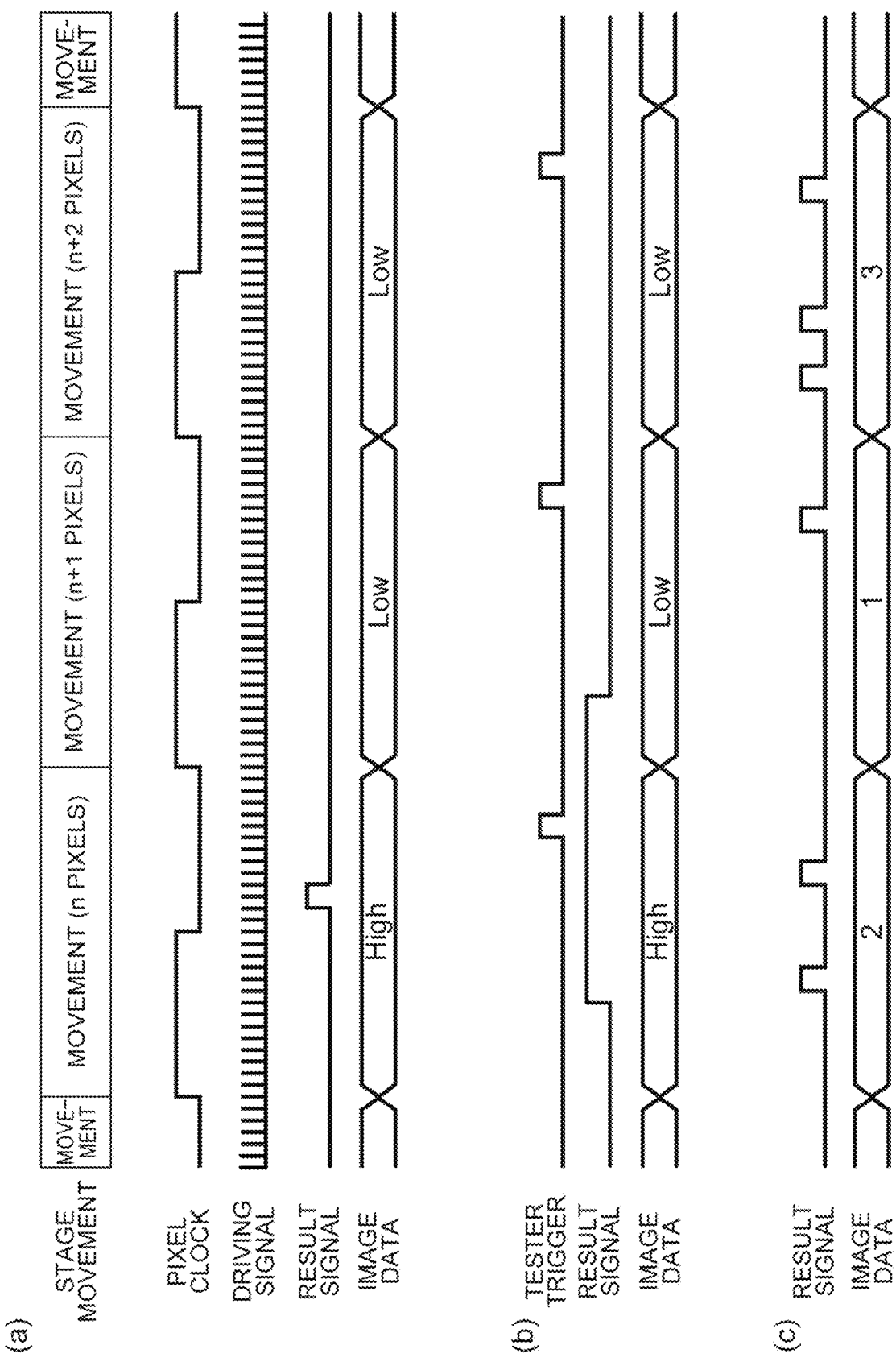
FIG. 3 is a timing diagram illustrating each signal in the semiconductor device inspection method.

FIG. 3 is a timing diagram illustrating an example of each signal or the like in the semiconductor device inspection method. Here, (a) of FIG. 3 shows the state of movement control of the stage 5 performed by the stage control unit 73, a pixel clock which is output from the timing control unit 11, a driving signal which is output from the pulse generator 71, a result signal which is output from the LSI tester 2, and image data generated based on the result signal. The shown example shows a case in which the stage 5 moves continuously in accordance with the pixel clock. That is, the stage control unit 73 moves the XY-axis stage 51 at a constant speed so that the position of scanning with the ultrasonic waves W moves by one pixel corresponding to one period of the pixel clock. The driving signal is shown as burst waves, and is consecutively output at a constant pulse interval. The result signal is output when a change in state occurs in each determination of Pass/Fail. In addition, the image data is data for mapping corresponding to each pixel. In the image data, data of any of High indicating there is a change in state (change from Pass to Fail or from Fail to Pass) and Low indicating that there is no change in state is associated with every pixel. In this case, the measurement image may be constituted by binaries of a gradation indicating High and a gradation indicating Low.

In addition, (b) of FIG. 3 and (c) of FIG. 3 show another example relating to the generation of the image data. In (b) of FIG. 3, a tester trigger which is output from the LSI tester 2 is shown. The tester trigger is a signal indicating a timing at which the result signal is acquired. The tester trigger is output in a constant period, for example, in accordance with the test pattern signal. Meanwhile, in the present example, the result signal is output over a period of time longer than in (a) of FIG. 3 so that the result signal can be reliably acquired at a timing of output of the tester trigger. As shown in the drawing, the result signal may extend between pixels. In the example of (b) of FIG. 3, High is associated with the image data in a case where the detection of the result signal is confirmed when the tester trigger signal is output, Low is associated therewith in a case where the result signal is not detected. In addition, (c) of FIG. 3 shows an example in which a plurality of result signals are output during scanning of one pixel in accordance with a change in state of Pass/Fail. In this case, information indicating the number of result signals which are output in one pixel is associated with the output image data. For example, in the shown example, data indicating "2" is associated with the image data in a case where the number of result signals is "2," data indicating "1" is associated with the image data in a case where the number of result signals is "1," and data indicating "3" is associated with the image data in a case where the number of result signals is "3." Meanwhile, in examples other than those shown in (a) to (c) of FIG. 3, the image data may be generated. For example, the image data may be generated based on information including a time at which the result signal in one pixel is output.

Figure 4:
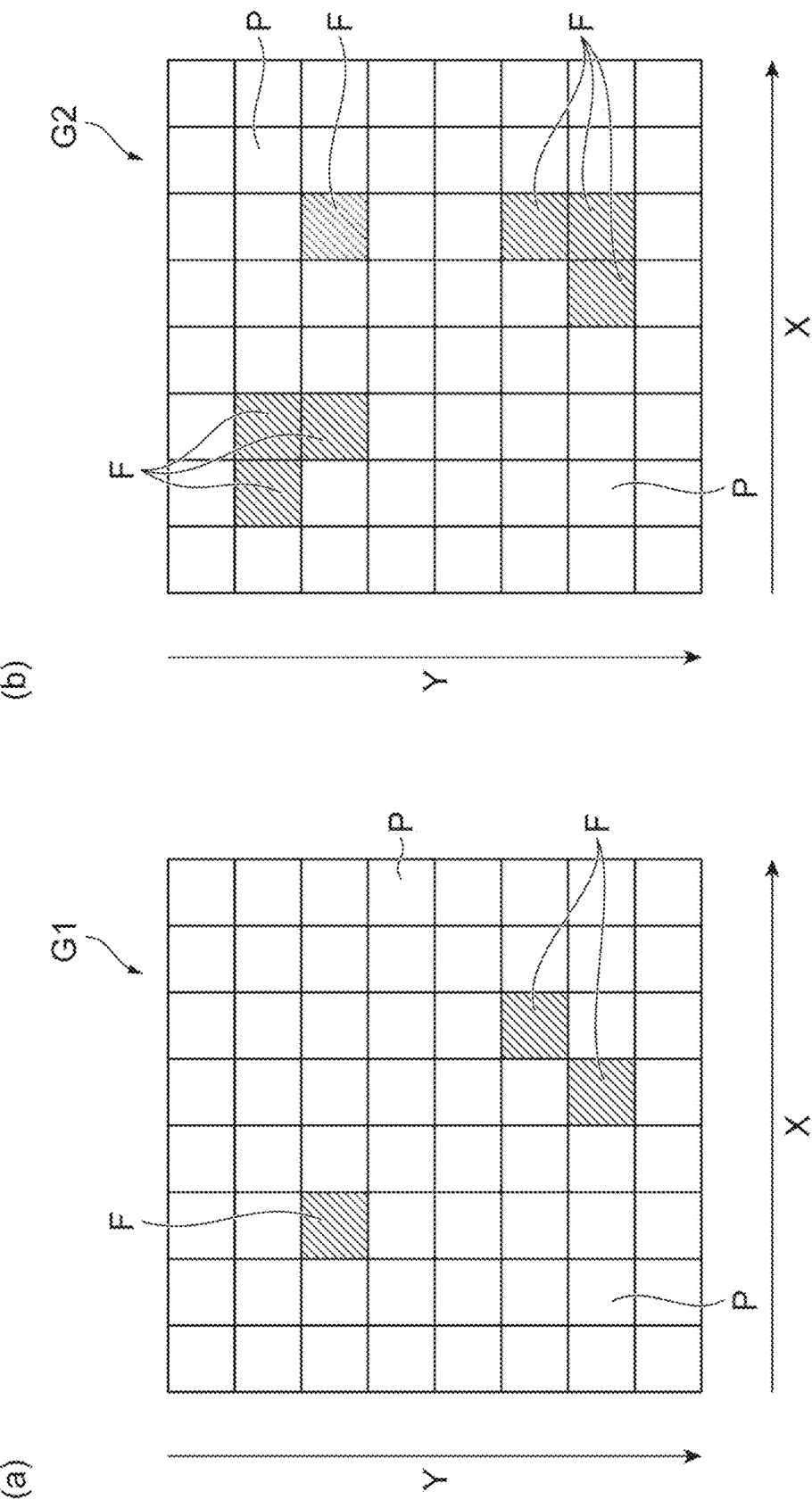
FIG. 4 is an example of a measurement image in an embodiment.

FIG. 4 is a diagram schematically illustrating an example of a measurement image generated by the semiconductor device inspection method; The measurement image shown in FIG. 4 is an image in which the image data generated based on the presence or absence of a change in state of Pass/Fail is mapped in association with a scanning position. In addition, (a) of FIG. 4 shows an example of a measurement image G1 in a case where ultrasonic waves of predetermined frequency, pulse width and pulse interval are output at a pulse intensity of 50% of a normal state. In addition, (b) of FIG. 4 shows an example of a measurement image G2 in a case where ultrasonic waves of predetermined frequency, pulse width, and pulse interval which are the same as the example of (a) of FIG. 4 are output at a pulse intensity of 100%. The measurement images G1 and G2 show a case in which a result signal indicating the presence of a change in state is detected, in a case where a Fail signal is detected in a pixel in which a Pass signal is to be detected. In this case, a pixel P in which a Pass signal is detected may be represented with, for example, white indicating Low, and a pixel F in which a Fail signal is detected may be represented with color indicating High. The example of FIG. 4 shows, for example, a case in which a scanning region is measured at a pulse intensity of 50%, and then the same scanning region is measured at a pulse intensity of 100%. In this example, in measurement when the pulse intensity is made higher, the number of pixels in which the result signal is output increases.

In the semiconductor device inspection apparatus 1 described above, the semiconductor device D is irradiated with the ultrasonic waves W by the ultrasonic transducer 31, a change in state may occur in the semiconductor device D. In a case where a change in state occurs in the semiconductor device D, a result signal indicating the change in state is output. The measurement image is generated by the computer 13 based on this result signal, and thus it is possible to analyze the semiconductor device D. The condition of stimulation by the ultrasonic waves W applied to the semiconductor device D is controlled by the stimulation condition control unit 7, and thus it is possible to apply various stimulations to the semiconductor device D. Therefore, since a result signal which is output in accordance with stimulation applied to even the same semiconductor device may be changed, it is possible to perform various analyses on a semiconductor device.

In addition, in an aspect, the stimulation condition control unit 7 includes the pulse generator 71 that outputs a driving signal. In this case, the pulse generator 71 can control at least one of the frequency, the number of pulses, the pulse interval, and the pulse intensity of the ultrasonic waves by controlling the driving signal. In this manner, the driving signal for driving the ultrasonic transducer 31 is controlled, and thus it is possible to control the ultrasonic waves W. For example, in a case where the frequency of ultrasonic waves is controlled, it is possible to control the penetration length (penetration depth) of the ultrasonic waves with respect to the semiconductor device. In addition, it is possible to control the magnitude of stimulation applied to the semiconductor device by controlling at least one of the number of pulses, the pulse interval, and the pulse intensity of the ultrasonic waves.

In addition, in an aspect, the stimulation condition control unit 7 includes the stage control unit 73 that controls the movement of the stage 5. In this case, the stage control unit 73 can controls at least one of the movement speed, movement interval, and movement distance of the stage 5. According to such a configuration, the movement of the stage 5 is controlled by the stage control unit 73, and thus it is possible to control an aspect of irradiation of the semiconductor device D with the ultrasonic waves W. Particularly, it is possible to control, for example, the time of irradiation of one pixel with the ultrasonic waves W by controlling the movement speed, movement interval, and movement distance of the stage. In this case, it is possible to change stimulation by the ultrasonic waves applied to the one pixel.

In addition, in an aspect, the computer 13 may generate a reflection image based on a detection signal from the receiver 35. According to such a configuration, it is possible to acquire a chip shape or a circuit pattern inside the semiconductor device D based on the reflection image.

In addition, in an aspect, the computer 13 may generate a superimposed image having the measurement image and the reflection image superimposed on each other. According to such a configuration, since the measurement image and a chip shape or a circuit pattern inside the semiconductor device D are superimposed on each other, the identification of a failure position or the like is facilitated.

Hereinbefore, the embodiments have been described in detail with reference to the accompanying drawings, but specific configurations are not limited to these embodiments.

Figure 5:
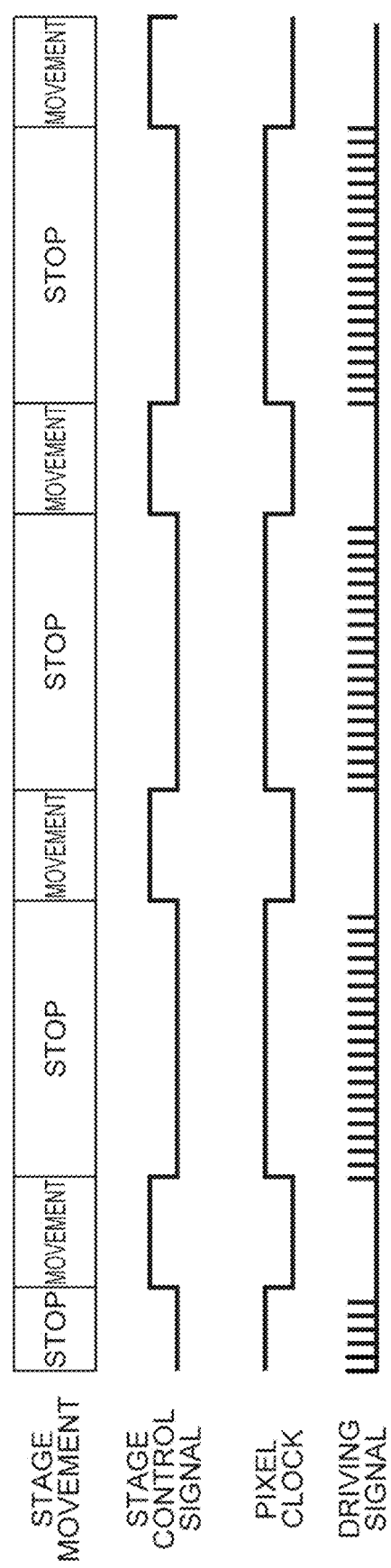
FIG. 5 is a timing diagram illustrating each signal in an inspection method according to another embodiment.

For example, FIG. 3 shows an example in which the stage 5 moves continuously in accordance with a pixel clock, but there is no limitation thereto. FIG. 5 is a timing diagram illustrating movement control of the stage 5 and each signal according to a modification example. FIG. 5 shows the state of movement control of the stage 5 performed by the stage control unit 73, a pixel clock which is output from the timing control unit 11, and a driving signal which is output from the pulse generator 71. In this example, the result signal, the image data, and the like are the same as those in the example of FIG. 3, and thus will be omitted. The shown example shows a case in which the stage 5 moves intermittently in accordance with the pixel clock. That is, the stage 5 repeats movement and stopping in a constant period. For example, during the movement of the stage 5, a stage control signal for moving the XY-axis stage 51 is output from the stage control unit 73. The pixel clock is synchronized with the stage control signal in a reversed state. The pixel clock is set to be in an ON state when the stage control signal is in an OFF state. That is, in the present example, one pixel is counted when the stage 5 is stopped. The driving signal is synchronized with the pixel clock. The driving signal is output when the pixel clock is in an ON state. Thereby, the ultrasonic waves W are not radiated in state where the stage 5 is moved, and the ultrasonic waves W are radiated in a state where the stage 5 is stopped. In this case, a stop time in one pixel is controlled by the stage control unit 73, and thus it is possible to control the stimulation of the ultrasonic waves W in one pixel.

Figure 6:
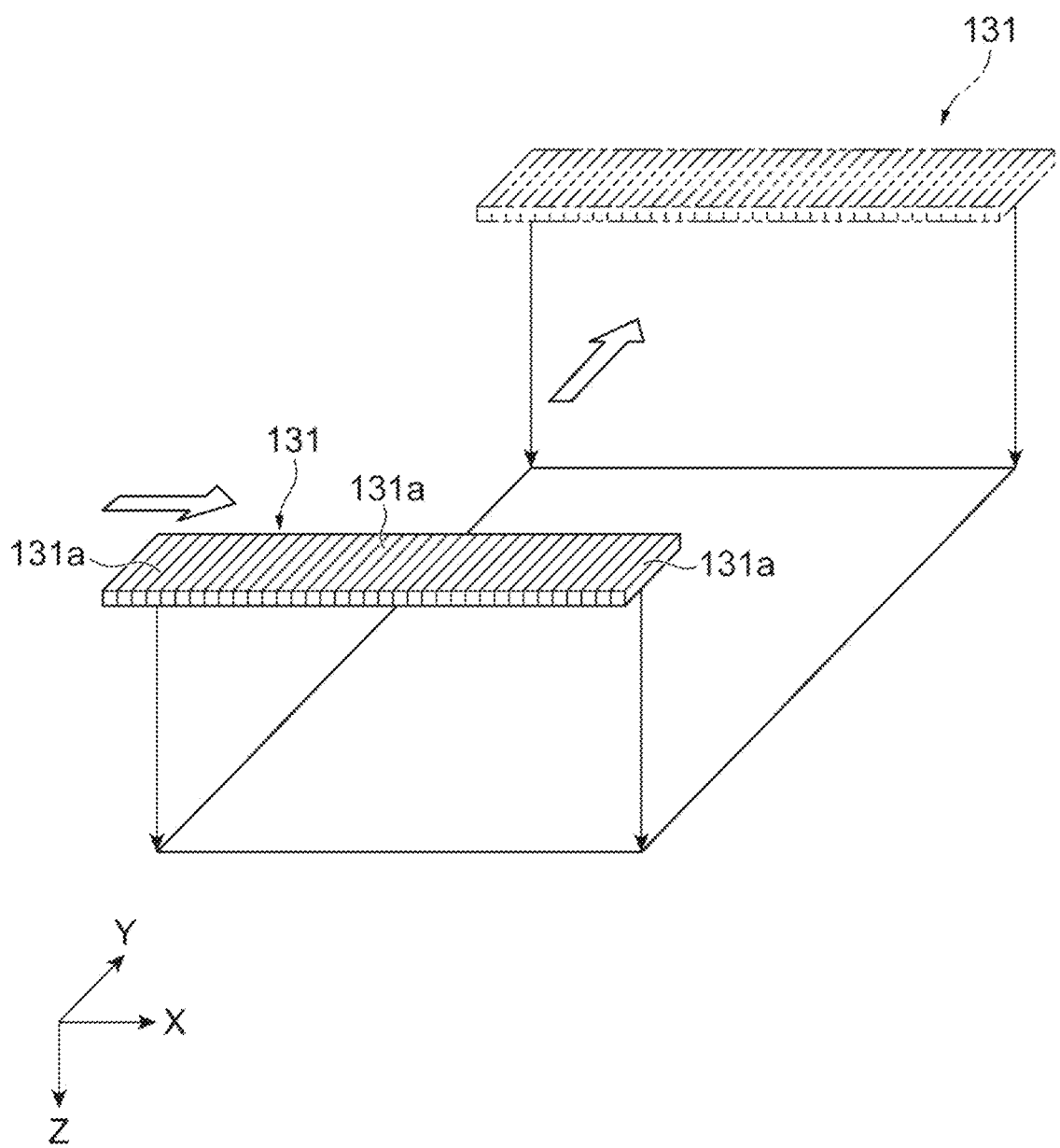
FIG. 6 is a schematic diagram illustrating an example of an array transducer.

In addition, the ultrasonic waves W may be generated using an array transducer instead of the ultrasonic transducer 31. FIG. 6 shows an example of an array transducer. Meanwhile, in FIG. 6, the Z-axis direction is depicted as a downward direction in order to make the drawing easier to understand. An array transducer 131 is configured such that a plurality of transducers 131a are arranged in a one-dimensional array. Therefore, it is possible to change the position of generation of ultrasonic waves in a one-dimensional direction by controlling the vibration of each transducer 131a. Therefore, it is possible to scan the position of generation of the ultrasonic waves in a one-dimensional direction without moving the stage 5. In a case where the array direction off the array transducer 131 is disposed along the X-axis direction, the control position of the array transducer 131 is adjusted while detecting reflected waves from the semiconductor device D due to the array transducer 131. In this case, it may be confirmed whether being set to a position of the semiconductor device D desired to be measured in the X-axis direction. In addition, regarding the Y-axis direction which is not controlled by the array transducer 131, similarly, movement control is performed on the stage 5 while detecting the reflected waves of the ultrasonic waves W. In this case, it may be confirmed whether being set to a position of the semiconductor device D desired to be measure in the Y-axis direction. In a case where the semiconductor device D is scanned by such an array transducer 131, scanning in the X-axis direction is performed by controlling the signal of each transducer 131a of the array transducer 131 in an array direction. A test pattern signal is input from the LSI tester 2 to the semiconductor device D, a test signal from the semiconductor device D is detected by the LSI tester 2, and a result signal is output. The length of the test pattern signal can be caused to correspond to a scanning time equivalent to one pixel or a stop time in one pixel. In this case, a driving signal which is input from the pulse generator 71 to the array transducer 131 is controlled, it is possible to control the stimulation of ultrasonic waves applied to one pixel. In addition, it is possible to adjust the stimulation of ultrasonic waves in one pixel by controlling the control position of the array transducer 131, scanning speed performed by the stage control unit, a stop time in one pixel, or the like. In this manner, it is possible to perform scanning in a direction along the array direction of the array transducer 131 without moving the relative position of the array transducer 131 with respect to the semiconductor device D.

In addition, for example, a signal from a semiconductor device body may be used instead of the signal from the LSI tester which is a test apparatus. In this case, an abnormal point is displayed by detecting a signal changed by the stimulation of ultrasonic waves. In such a method, for example, a so-called evaluation board can be used. In this case, a semiconductor device stored in a package is inserted into a socket mounted in an evaluation board and is brought into operation. The evaluation board is supplied with a power supply voltage. In addition, a driving signal may be input from the outside by the pulse generator or the like, or a circuit that generates a driving signal may be incorporated into the evaluation board. In addition, supply of a signal from a computer or the like to the evaluation board may be controlled. In this case, a semiconductor device is operated by the supplied signal, and a signal indicating a result obtained by evaluating the operation is output. Examples of such a signal include a voltage or a current in a specific pin of a socket, a high/low logic waveform, an analog waveform, and the like. For example, in a case where such signals are changed from a normal value by the stimulation of ultrasonic waves to a specific location, output of any of these signals may be used as a signal for displaying a change point similarly to the Pass/Fail signal. In this case, a predetermined comparison circuit is installed, and thus various output abnormalities caused by the stimulation of ultrasonic waves can be taken up as signals. Such a comparison circuit may be, for example, a circuit that converts a logic waveform into a TTL signal, and compares whether the TTL signal is different from a normal TTL signal. In addition, the above circuit may be a circuit that outputs the frequency of a measured output waveform in a digital manner and performs comparison with a normal value. In addition, in case where a computer connected to the evaluation board adopts a method in which an evaluation result in the evaluation board is taken up, a signal is transmitted from the computer to an analysis apparatus, and thus an output abnormality portion can also be displayed. Such display may be display by digital values obtained by performing 0/1 determination. In addition, a function capable of calculating a shift from a normal value is provided, and thus the intensity or sign of signal display may be changed based on the amount of shift. In this case, it is possible to display an abnormal location more obviously.

REFERENCE SIGNS LIST

1 Semiconductor device inspection apparatus
5 Stage
7 Stimulation condition control unit
11 Timing control unit
13 Computer (analysis unit)
31 Ultrasonic transducer
35 Receiver (reflected wave detection unit)
71 Pulse generator (signal generation unit)
73 Stage control unit

The invention claimed is:

1. An apparatus for inspecting a semiconductor device which is an object to be inspected based on a result signal which is output in accordance with input of a test pattern signal to the semiconductor device, the apparatus comprising:
   an ultrasonic transducer, disposed to face the semiconductor device, which generates ultrasonic waves;
   a stage configured to move a relative position of the semiconductor device and the ultrasonic transducer;
   a stimulation condition controller configured to control a condition of stimulation by the ultrasonic waves applied to the semiconductor device; and
   an analyzer configured to generate a measurement image based on the result signal indicating pass/fail information generated in accordance with a test signal which is output from the semiconductor device in which the test pattern signal is input.

2. The inspection apparatus according to claim 1, wherein the stimulation condition controller includes a signal generator configured to output a driving signal for driving the ultrasonic transducer to the ultrasonic transducer.

3. The apparatus according to claim 2, wherein the signal generator controls at least one of a frequency, the number of pulses, a pulse interval, and a pulse intensity of the ultrasonic waves by controlling the driving signal.

4. The apparatus according to claim 1, wherein the stimulation condition controller includes a stage controller configured to control movement of the stage.

5. The apparatus according to claim 4, wherein the stage controller controls at least one of a movement speed, a movement interval, and a movement distance of the stage.

6. The apparatus according to claim 1, further comprising a reflected wave detector configured to detect reflected waves of the ultrasonic waves reflected from the semiconductor device,
   wherein the analyzer generates a reflection image based on a detection signal from the reflected wave detector.

7. The apparatus according to claim 6, wherein the analyzer generates a superimposed image having the measurement image and the reflection image superimposed on each other.

8. The apparatus according to claim 1, wherein the ultrasonic transducer includes an array transducer.

9. A method for inspecting a semiconductor device which is an object to be inspected, the method comprising:
   inputting a test pattern signal to the semiconductor device;
   controlling a condition of stimulation by an ultrasonic waves applied to the semiconductor device;
   generating the ultrasonic waves based on the condition and scanning the semiconductor device with the ultrasonic waves; and
   generating a measurement image based on a result signal indicating pass/fail information generated in accordance with a test signal which is output from the semiconductor device in accordance with input of the test pattern signal.

10. The method according to claim 9,
wherein the controlling includes generating a driving signal for driving and controlling an ultrasonic transducer that generates the ultrasonic waves.

11. The method according to claim 10,
wherein the generating the driving signal includes controlling at least one of a frequency, the number of pulses, a pulse interval, and a pulse intensity of the ultrasonic waves by controlling the driving signal.

12. The method according to claim 9,
wherein the controlling the condition of stimulation by the ultrasonic waves includes a controlling movement of a position of irradiation of the semiconductor device with the ultrasonic waves.

13. The method according to claim 12,
wherein the controlling the movement includes controlling at least one of a movement speed, a movement interval, and a movement distance of the position of irradiation of the semiconductor device with the ultrasonic waves.

14. The method according to claim 9, further comprising a detecting reflected waves of the ultrasonic waves reflected from the semiconductor device to generate a detection signal, and generating a reflection image based on the detection signal.

15. The method according to claim 14, further comprising generating a superimposed image having the measurement image and the reflection image superimposed on each other.

* * * * *